United States Patent
Choi et al.

(10) Patent No.: US 11,069,750 B2
(45) Date of Patent: Jul. 20, 2021

(54) FLEXIBLE COLOR FILTER, FLEXIBLE ORGANIC LIGHT EMITTING DISPLAY DEVICE COMPRISING SAME, AND MANUFACTURING METHOD THEREFOR

(71) Applicant: DONGWOO FINE-CHEM CO., LTD., Iksan-si (KR)

(72) Inventors: Young Seok Choi, Yongin-si (KR); Ju In Yoon, Pyeongtaek-si (KR); Min Soo Seo, Pyeongtaek-si (KR); Woo Choi, Asan-si (KR)

(73) Assignee: Dongwoo Fine-Chem Co., Ltd., Jeollabuk-do (KR)

(*) Notice: Subject to any disclaimer, the term of this patent is extended or adjusted under 35 U.S.C. 154(b) by 716 days.

(21) Appl. No.: 15/579,091

(22) PCT Filed: May 27, 2016

(86) PCT No.: PCT/KR2016/005601
§ 371 (c)(1),
(2) Date: Dec. 1, 2017

(87) PCT Pub. No.: WO2016/195323
PCT Pub. Date: Dec. 8, 2016

(65) Prior Publication Data
US 2018/0175115 A1    Jun. 21, 2018

(30) Foreign Application Priority Data

Jun. 3, 2015   (KR) ................. 10-2015-0078385
May 12, 2016  (KR) ................. 10-2016-0058290

(51) Int. Cl.
*H01L 27/32*   (2006.01)
*G02B 5/20*    (2006.01)
(Continued)

(52) U.S. Cl.
CPC ............ *H01L 27/322* (2013.01); *G02B 5/201* (2013.01); *H01L 27/3213* (2013.01);
(Continued)

(58) Field of Classification Search
CPC . H01L 27/32; H01L 27/3206; H01L 27/3211; H01L 27/3213; H01L 27/322;
(Continued)

(56) References Cited

U.S. PATENT DOCUMENTS 7,649,311 B2   1/2010 Park et al.
9,236,420 B2   1/2016 Lee et al.
(Continued)

FOREIGN PATENT DOCUMENTS

KR    1020000039656    7/2000
KR    1020040097228    11/2004
(Continued)

OTHER PUBLICATIONS

English translation of KR 20130049106, machine translated, Nov. 18, 2020.*

(Continued)

*Primary Examiner* — Jie Lei
(74) *Attorney, Agent, or Firm* — DLA Piper LLP (US)

(57) ABSTRACT

There is provided a flexible color filter for a display device, a flexible organic light-emitting display device comprising the color filter, and a manufacturing method therefor and, more specifically, a flexible color filter having a structure in which a base film, an adhesive layer, a separation layer, a protective layer, a black matrix layer, a pixel layer formed between different portions of the black matrix layer, and a planarization layer are sequentially stacked. The flexible color filter having the structure can be manufactured on a glass substrate, and thus advantages of solving a problem of thermal deformation of a plastic substrate in a high tem- (Continued)

perature process for implementing a color filter, enabling a fine pitch of a pattern, which cannot be implemented on a plastic substrate, and enabling diversification without limitations for a material of a base film can be secured.

9 Claims, 6 Drawing Sheets

(51) Int. Cl.
*H01L 51/52* (2006.01)
*H01L 51/56* (2006.01)

(52) U.S. Cl.
CPC ...... *H01L 27/3246* (2013.01); *H01L 27/3272* (2013.01); *H01L 51/5253* (2013.01); *H01L 51/56* (2013.01); *H01L 27/323* (2013.01); *H01L 27/3262* (2013.01); *H01L 51/5284* (2013.01); *H01L 2227/323* (2013.01); *H01L 2251/5338* (2013.01)

(58) Field of Classification Search
CPC ............... H01L 27/3225; H01L 27/323; H01L 27/3241; H01L 27/3244; H01L 27/3246; H01L 27/3262; H01L 27/3272; H01L 51/50; H01L 51/52; H01L 51/5253; H01L 51/5281; H01L 51/5284; H01L 51/56; H01L 2227/32; H01L 2227/323; H01L 2251/50; H01L 2251/53; H01L 2251/5338; G02B 5/20; G02B 5/201; G02B 5/30; G02B 5/3025; G02B 5/22; G02B 5/223; G03F 7/0007; G09G 2380/02
USPC ....... 359/885, 887, 888, 891, 308, 310, 316; 349/106, 111, 122, 158
See application file for complete search history.

(56) References Cited

U.S. PATENT DOCUMENTS

2005/0140282 A1  6/2005  Park et al.
2014/0183478 A1  7/2014  Lee et al.

FOREIGN PATENT DOCUMENTS

| KR | 1020050068794 | 7/2005 |
| KR | 1020050119445 | 12/2005 |
| KR | 1020100047029 | 5/2010 |
| KR | 1020130049106 | 5/2013 |
| KR | 1020140085306 | 7/2014 |

OTHER PUBLICATIONS

International Search Report, International Patent Application No. PCT/KR2016/005601, dated Sep. 19, 2016.

* cited by examiner

FLEXIBLE COLOR FILTER, FLEXIBLE ORGANIC LIGHT EMITTING DISPLAY DEVICE COMPRISING SAME, AND MANUFACTURING METHOD THEREFOR

CROSS-REFERENCE TO RELATED APPLICATIONS

The present application is the 35 U.S.C. § 371 National Stage Application of PCT/KR2016/005601, filed May 27, 2016, which claims priority to and the benefit of Korean Patent Application No. 10-2016-0058290, filed on May 12, 2016 and Korean Patent Application No. 10-2015-0078385, filed Jun. 3, 2015, the disclosures of which are incorporated herein by reference in their entirety.

FIELD OF INVENTION

The present invention relates to a flexible display, more particularly, relates to a flexible color filter and an OLED display comprising same, and a manufacturing method thereof.

BACKGROUND

As the use of internet has become a common practice these days and the amount of information being communicated is explosively increasing, 'ubiquitous display' environment will be created in the future for accessing information anytime and anywhere; accordingly, the role of mobile displays such as notebook, electronic note, PDA, and the like which are media for outputting information becomes important.

In order to implement such 'ubiquitous display' environment the portability of display is required for prompt information access at a desired time and place, and at the same time a large screen property is required for displaying information through various multi-media as well.

Therefore, in order to suffice such portability and the large screen property simultaneously, there is a need to develop a display having a structure such that it can be used unfolded when functioning as a display and being stored folded while carrying thereof by allowing the flexibility to the display Liquid-crystal displays (LCDs) and organic light-emitting diode (OLED) displays are the representative types among the displays most widely used at the present time.

OLED can implement a very light and thin screen when compared with existing LCD, and has advantages of a wide color reproduction range, a fast response time, and a high contrast ratio (CR); in addition to these, it is the most suitable display for implementing flexible displays, and researches on OLED are actively undergoing in these days.

More particularly, the white organic light-emitting diode (WOLED) display using white light source instead of conventional blue light source has a high efficiency, a high resolution, and a long lifetime characteristics; and full-scale researches are going on by the researchers in Korea and abroad due to the various application possibilities thereof not only for implementing it as a large area and high image quality display, but also for general purpose illumination.

Color filters are used for implementing full color in WOLED. The color filters being used at this time are produced by forming a black matrix (BM) on a glass substrate, and on the upper side of it, the patterns of red, green, blue, and white are formed.

However, since the glass substrates being used for the color filters are heavy and easily damaged by a small external impact, there is a limitation in the portability and the large screen display characteristics. Accordingly, plastic substrates which are not only light and strong against impact but also having flexible characteristics are being used.

Flexible display is a next generation display which can be freely twisted, or bent, or folded; and since application in various shapes such as a mobile and portable display, a wearable and fashionable display, a paper-like display, and the like is possible, research and development are continuously in progress. Therefore, glass substrates of various components constituting flexible displays are being replaced by polymer plastic substrates.

There are many advantages in utilizing flexible plastic substrates instead of existing glass substrates in the aspects of portability and safety when compared to existing glass substrates. Further, in the aspects of process, the manufacturing cost can be reduced since plastic substrates can be manufactured through deposition or printing; and furthermore, low cost displays can be manufactured through mass production since displays can be manufactured by roll-to-roll process unlike the existing sheet-by-sheet process.

However, since such plastic substrates have a lower transition temperature and a higher expansion rate depending on temperature change when compared to glass substrates, there is a problem in that the layer being stacked thereupon can be damaged or deformed. Especially, since the substrate itself is flexible there is a problem in that the processes applied to the existing glass substrates may not be equally applied thereto.

Accordingly, Korea Patent Publication No. 2010-0047029 is describing a method of low temperature electron beam curing capable of curing under the temperature less than 100° C. in manufacturing of color filters for electronic displays.

In addition, Korea Patent Publication No. 2004-0097228 discloses a method of separating glass substrate and the transferred layer by illuminating the light such as a laser after sequentially forming a separation layer, a thin film device, an adhesive layer, and a temporary substrate on a glass substrate.

Such patents are intended for improving the thermal instability occurring when using plastic substrates, however, the effects thereof are not sufficient since there is limitation in plastic materials to which the low temperature curing method can be applied, or additional equipments are required for the separation process.

LEADING TECHNICAL LITERATURES

Patent Literatures (Patent Literature 1) Korean Unexamined Patent Application Publication No. 2010-0047029
(Patent Literature 2) Korean Unexamined Patent Application Publication No. 2004-0097228

SUMMARY OF THE INVENTION

Disclosure of Invention

Technical Problem

Accordingly, as a result of performing researches in various aspects for obtaining the superior flexibility of the plastic substrate together with the excellent color quality of the color filters, the applicants of this application completed the present invention by verifying that the above described problems can be solved through a manufacturing process wherein color filter is manufactured after forming a separation layer (or exfoliating layer), or a separation layer and a protection layer on a glass substrate, and then the glass substrate is removed and the base material film is adhered.

Thus, an objective of the present invention is to obtain high resolution patterns that are difficult to implement on the existing plastic substrates, and to provide flexible color filters wherein the thermal instability thereof is resolved, and base material films of versatile materials can be applied thereto.

Further, another objective of the present invention is to provide flexible (white) OLED displays comprising flexible color filters wherein the thermal instability thereof is resolved, and base material films of versatile materials can be applied thereto.

Solution to Problem

In order to achieve the above described objectives, the present invention provides a flexible color filter having a structure wherein a base material film, an adhesive layer, a separation layer, a protection layer (optional element), a black matrix layer; and a pixel layer formed between different portions of the black matrix layer, are sequentially stacked.

It is characterized in that at least one layer selected from a base material film, a separation layer, a protection layer, a black matrix layer, a pixel layer, and a combination thereof has the rate of change in the shear stress defined as the equation below is within the range of 40 to 95%.

$$\text{Rate of change in shear stress } (\%) = \frac{SS_1 - SS_0}{SS_0} \times 100$$

(In the equation above, $SS_0$ is the shear stress (MPa) measured in the initial stage of curing under the temperature between 15 to 30° C., and $SS_1$ is the shear stress (MPa) measured 5 hours after the curing under the temperature between 15 to 30° C.)

Also, it is characterized in that at least one layer selected from a base material film, a separation layer, a protection layer, a black matrix layer, a pixel layer, and a combination thereof has the tensile modulus within the range of 2 to 10 MPa.

Also, it is characterized in that the separation layer has the peel strength against the glass substrate less than 1 N/25 mm.

Also, it is characterized in that the separation layer has the surface energy within the range of 30 to 70 mN/m after peeling thereof.

In addition, for manufacturing of the above described flexible color filter, the present invention performs the steps of:

forming a separation layer by coating a composite material for forming the separation layer on a glass substrate;

forming a protection layer by coating a composite material for forming the protection layer on the separation layer;

forming a black matrix layer on the protection layer, followed by forming a red, a green, a blue, and a white pixel layer between different portions of the black matrix layer;

forming a planarization layer by coating a composite material for forming the planarization layer all over the pixel layer (optional step);

adhering a protection film wherein a pressure sensitive adhesive layer is coated in the one side surface thereof with the planarization layer;

separating the separation layer from the glass substrate;

adhering a base material film wherein the adhesive layer is coated in the one side thereof with the separation layer; and removing the protection film.

In addition, it is characterized in that the present invention provides a flexible (white) OLED display including the flexible color filter.

Advantageous Effects of Invention

Flexible color filter according to an exemplary embodiment of the present invention may obtain a high resolution pattern, which is difficult to implement on an existing plastic substrate, and resolve the thermal instability, and base material films made of various materials can be applied thereto.

In addition, the flexible color filter according to an exemplary embodiment of the present invention can easily be applied to a curved object such as a column and the like; owing to the high resolution, the color reproduction property thereof is superior to that of the color filter of the prior art, so that the realistic image quality can be implemented, therefore it can be applied to a flexible OLED display or a flexible white OLED display.

DETAILED DESCRIPTION OF THE INVENTION

Figure 1:
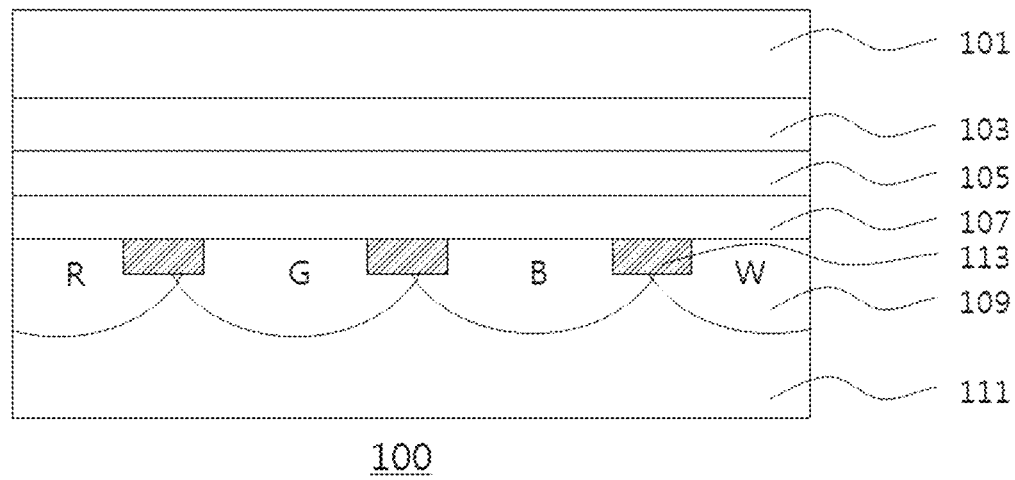
FIG. 1 is an exemplary view of the cross-sectional structure of a flexible color filter according to an exemplary embodiment of the present invention.

The present invention provides a flexible color filter wherein the thermal stability of the plastic substrate required during the manufacturing process of a flexible color filter is enhanced so that a high resolution pattern can be manufactured, and the heat-resisting property becomes (is) superior, and besides, there is no limitation in the materials that can be used for the plastic substrate.

Color filter is an essential component for expressing colors. A typical color filter manufacturing process includes high temperature processes and the various cleaning processes using a glass substrate. However, since plastic substrates have a weak stiffness and a lower thermal deformation temperature, thermal deformations such as bending, twisting, expansion, contraction, and the like of the plastic substrates are occurring during the course of processes involving high temperature treatments. Thus, when the processes are performed directly on a plastic substrate, problems are occurring such that not only the heat treatment condition and the like are being limited but also the control of the fine pattern finally obtained becomes difficult.

The present invention is advantageous in that: the flexibility as a flexible color filter is secured by limiting the polymer material for each layer constituting the color filter to a specific factor so that no permanent deformations, fractures, or cracks are occurring; and in the manufacturing process, by separately undergoing the adhesion process of the basic material film at the room temperature after performing the manufacturing process of color filter on a glass substrate which is not a basic material film as a plastic substrate, the problems related to thermal deformation of the plastic substrate of the prior art can be resolved, and high resolution patterns that cannot be implemented in a plastic substrate can be obtained as well; and diversification in the materials of the base material film becomes possible without limitation.

Hereinafter, the present invention will be described more in detail with reference to the accompanying drawings. However, the drawings attached to this specification are mere examples for explaining the present invention, and the present invention is not limited by the drawings. Besides, for the convenience of explanation, some elements may be exaggeratedly expressed, reduced, or omitted in the drawings.

Embodiment Example 1 of Flexible Color Filter

FIG. 1 is a cross-sectional view illustrating a flexible color filter according to an exemplary embodiment of the present invention.

Referring to FIG. 1, a flexible color filter 100 according to an exemplary embodiment of the present invention has a structure, wherein a base material film 101, an adhesive layer 103, a separation layer 105, a protection layer 107, a black matrix layer 113, a pixel layer 109 (R, G, B, and W) formed between different portions of the black matrix layer, and a planarization layer 111 are sequentially stacked.

As mentioned above, for the flexibility as a flexible color filter 100, in the present invention, the polymer material for each layer is specified and referred to as 'organic layer' for the convenience sake; and such 'organic layer' includes at least one layer selected from a group consisting of a base material film 101, a separation layer 105, a protection layer 107, a black matrix layer 113, a pixel layer 109, a planarization layer 111 and a combination thereof, and preferably they could be the separation layer 105 and the protection layer 107. More preferably, it could be the separation layer 105. For reference, the planarization layer 111 and the protection layer 107 are the layers that can be formed additionally as necessary.

A flexible color filter 100 comprising a base material film 101, a separation layer 105, a protection layer 107, a black matrix layer 113, a pixel layer 109, and a planarization layer 111 can be applied to a flexible display use for a curve object such as a column due to the bendable characteristics thereof. At this moment, a bending moment is generated due to the bending (of the flexible display) when being applied to the curved object, and the shear stress is focused on the flexible color filter 100 due to the loading. Such focused shear stress causes permanent deformation, fractures, or cracks of the flexible color filter 100. Thus, when a material which can sufficiently stand the focused shear stress and capable of restoring from the deformation is applied to the organic layer, the role of the flexible color filter 100 can be performed sufficiently.

Thus, in the exemplary embodiment of the present invention, the parameters of the shear stress and the tensile modulus of the organic layer are being adjusted.

As for the shear stress parameter, the shear stresses before and after the curing of the material of each organic layer are measured, and the differences between the shear stresses before and after the curing are controlled. The shear stress is a physical property whose characteristics are being changed in accordance with the changes in temperature, and the rate of change is verified by the measured values within the specified temperature range before and after the curing. Thus, in the exemplary embodiment of the present invention, the rate of change is verified by using the shear stress values measured within the temperature range of 15 to 30° C. before and after the curing. In addition, the characteristics of the flexible color filter can be maintained even if it has undergone the coating and the light exposing process of the manufacturing processes, by using the differences in the shear stress before and after performing the curing process.

Preferably, the rate of change of the shear stress of the organic layer according to the exemplary embodiment is defined as Equation 1 below:

$$\text{Rate of change in shear stress } (\%) = \frac{SS_1 - SS_0}{SS_0} \times 100 \qquad \text{Equation 1}$$

(In Equation 1 above, $SS_0$ is the shear stress (MPa) measured in the initial stage of curing under the temperature between 15 to 30° C., and $SS_1$ is the shear stress (MPa) measured 5 hours after the curing under the temperature between 15 to 30° C.)

At this time, the rate of change in shear stress of the organic layer is in the range of 40 to 95%, preferably to be in the range of 50 to 95%. If the rate of change in shear stress is less than the above described range, its original state cannot be restored due to the weak restoring force; on the contrary, if the above described range is exceeded, a fracture may occur; therefore, it should be properly adjusted within the above described range.

Including the above described rate of change in shear stress, the tensile modulus of the organic layer according to an exemplary embodiment of the present invention is being adjusted. The tensile modulus is a mechanical property representing how much it can withstand without being permanently deformed and damaged within the elasticity limit when bending load is applied, and defined by the value (ratio) of the applied tensile stress divided by the deformation (ratio) at the given stress level, and this a factor affecting the function and the lifetime of a flexible color filter 100. At this time, a sample of length of 5 cm and width of 1 cm is being prepared, and load (weight) is applied thereto (sample) by using the Autograph (a product of Shimadzu) at a speed of 4 mm/min along the vertical direction at 25° C. so that the gap between the chuck is being widened, and at this time the force is measured, and then the tensile modulus is calculated from the thickness of the film, the force, and the amount of calculation.

Preferably, the tensile modulus of the organic layer according to the present invention is in the range of 2 to 10 MPa, more preferably in the range of 2 to 7 MPa. If the tensile modulus is less than the above described range, there is a concern that a deformation or a fracture may occur during the usage of the flexible color filter 100; on the contrary, if the above described range is exceeded, a number of cracks may occur; therefore, it should be properly adjusted within the above described range.

As described above, by controlling the rate of change in shear stress and the tensile modulus of the organic layer, the flexibility of the flexible color filter is obtained and the occurrence of a permanent deformation, fractures, or cracks can be suppressed.

A polymer material may be used as a material for the organic layer which suffices such properties. Preferably, the above mentioned polymer materials include one type of material selected from a group consisting of: polyacrylate, polymethacrylate (e.g. PMMA), polyimide, polyamide, polyamic acid, polyvinyl alchohol, polyolefin (e.g. PE, PP), polystyrene, polynorbornen, polymaleimide, polyazobenzene, polyester (e.g. PET, PBT), polyallylate, phthalimidine, polyphenylenephthalamide, polyvinylcinnamate, polycinnamate, coumarin-series polymer, chalcone polymer, aromatic acetylene series polymer, phenyl maleimide copolymer, copolymers thereof, and blends thereof.

The above mentioned polymer materials can be respectively applied to at least one layer selected from a group consisting of: a base material film 101, a separation layer 105, a protection layer 107, a black matrix layer 113, a pixel layer 109, a planarization layer 111, and a combination thereof. As an example, an identical or a similar polymer can be respectively applied to all of the layers, or polyacrylate is applied only to the separation layer 105 and the publicly known materials in this field can be used for the remaining layers.

Hereinafter, each of the layers constituting a flexible color filter 100 according to an exemplary embodiment of the present invention will be described in detail.

Although any film commonly used as a transparent film for optical use can be used as a base material film 101, above all, it is preferred to use a film having superior characteristics in terms of flexibility, transparency, thermal stability, moisture shielding, phase difference uniformity, isotropy, and the like. By using the base material film 101, damages can be prevented during manufacturing, transporting, storing, and handling of the color filter become easy.

The aforesaid polymer materials or commonly used polyethylene terephthalate, polyethylene, polystyrene, polycarbonate, polyimide, and the like may be used as a material for the base material film 101.

The adhesive layer 103 is for adhering the base material film 101 and the separation layer 105, which will be described later, and a surface treatment such as corona treatment, flame treatment, plasma treatment, UV light illumination, primer deposition, saponification treatment, and the like may be performed on the polarizing film and/or the protection film in order to enhance the adhesion characteristic between the two layers.

The adhesive layer 103 can be formed through deposition of a coating composite material on one side surface of the base material film 101 or the separation layer 105; or, it can be laminated in the form of a film.

Materials for the adhesive layer 103 are not specifically limited in the present invention, and they may be commonly used polyacrylate, epoxy resin, and the like.

Meanwhile, the separation layer 105 is a layer being formed for the separation from the glass substrate wherein the color filter is being formed during the manufacturing process of the flexible color filter 100 of the present invention.

The separation layer 105 must be separable from the glass substrate, which is used for the manufacturing of the color filter, by using a physical force; and after the separation filter, it is being stacked on the base material layer 101 through the aforesaid adhesion layer 103. Therefore, the peel strength of the separation layer 105 against the glass substrate is less than 5 N/25 mm, preferably, to be 1 N/25 mm; and, preferably, the surface energy after the separation is in the range of 30 to 70 mN/m. The surface energy is an element related to the contact angle, it has a low adaptability when the surface energy is within the above mentioned range after the separation, so when the composite material for the adhesive layer is being deposited the adhesion property can be enhanced due to the superior coatability thereof.

The protection layer 107 is a layer for protecting the separation layer 105, and formed on the separation layer 105; it is also preferred to have the shape of encapsulation so that the both side surfaces of the separation layer 105 are being encompassed. Such protection layer 107 is an optional element that may be omitted as necessary.

The pixel layer 109 is the layer for implementing colors, and generally, patterned red, green, blue, and white pixel layer 109 is disposed with a black matrix layer 113. The pixel layer 109 includes at least one of three primary colors and white color; and the black matrix layer, which is the light shielding layer, is located between the patterned pixels and performs the role of blocking the light excluding the pixel areas.

The planarization layer 111 is a layer for compensating the surface height differences of the above described pixel layer 109 and enhancing the surface flatness, and also referred to as an overcoating layer (OC layer).

Materials for planarization layer 111 are not specifically limited in the exemplary embodiments of the present invention, and they may be commonly used polyacrylate, polyimide, polyester, and the like. Such planarization layer 111 is also an optional element.

The thickness of each of the organic layers is not specifically limited in the exemplary embodiments of the present invention, however, a thinner thickness is more advantageous for thinning of the flexible color filter and the flexible display using same, and thus, it is preferred that the thickness of each of the organic layers is to be less than few micrometers.

Preferably, a flexible color filter 100 according to an exemplary embodiment of the present invention may include:

a base material film 101 of polyimide series material having the thickness of 10 to 100 μm;

an adhesive layer 103 of denaturalized epoxy acrylate series material having the thickness of 0.5 to 30 μm;

a separation layer 105 of polyacryl series material having the thickness of 0.01 to 1.0 μm;

a protection layer 107 of polycycloolefin series material having the thickness of 0.5 to 5 μm;

a pixel layer 109 having the thickness of 0.5 to 5 μm; and a planarization layer 111 of polyacryl series material having the thickness of 0.5 to 5

A flexible color filter 100 having the above described structure according to an exemplary embodiment of the present invention is not being manufactured directly on the base material film of flexible plastic material; instead, it undergoes a process wherein a separation layer (and a protection layer) is first formed on a glass substrate, and the color filter is formed on the upper side of the separation layer, and later the separation layer is peeled off, and then the base material film is adhered thereto.

FIGS. 2 to 11 are the views illustrating the cross-sections corresponding to the steps according to a manufacturing method of the flexible color filter 100 according to an exemplary embodiment of the present invention.

Figure 2:
FIGS. 2 to 11 are the exemplary views of the cross-sections corresponding to the steps according to a manufacturing method of the flexible color filter according to an exemplary embodiment of the present invention.
Figure 3:
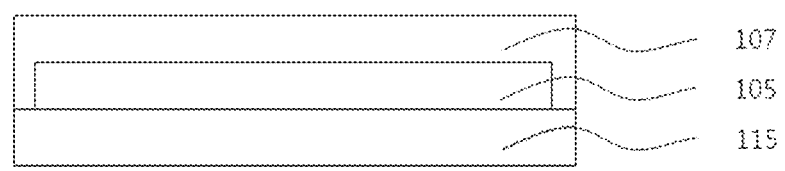
Figure 4:
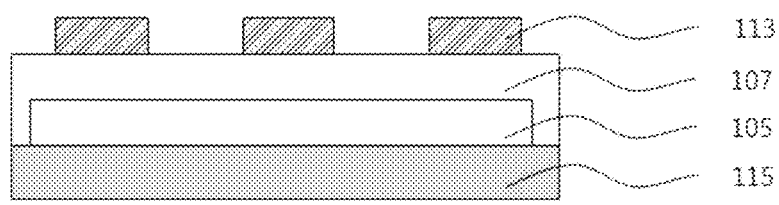
Figure 5:
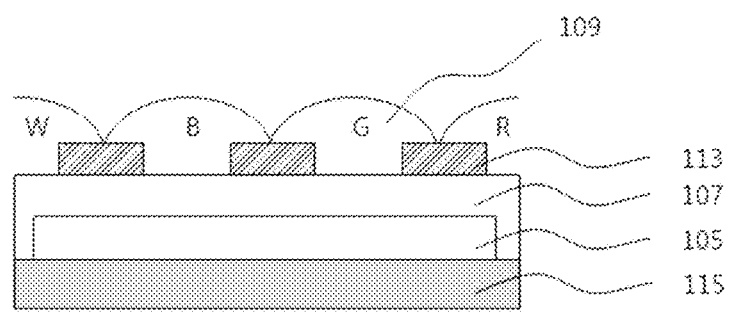
Figure 6:
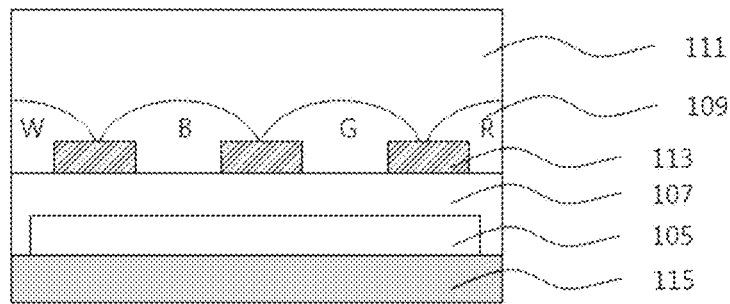
Figure 7:
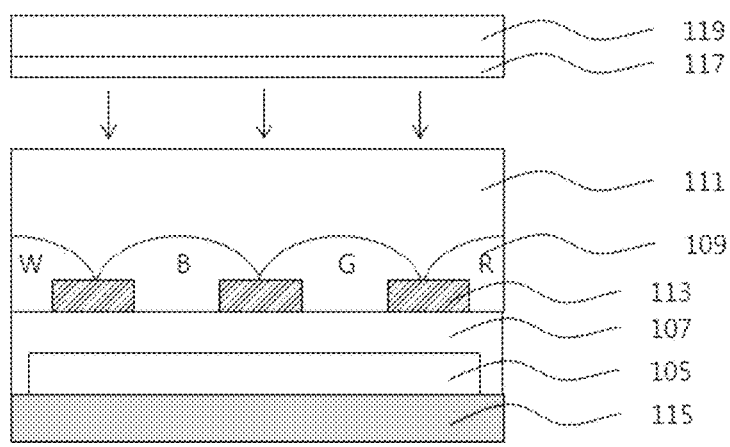
Figure 8:
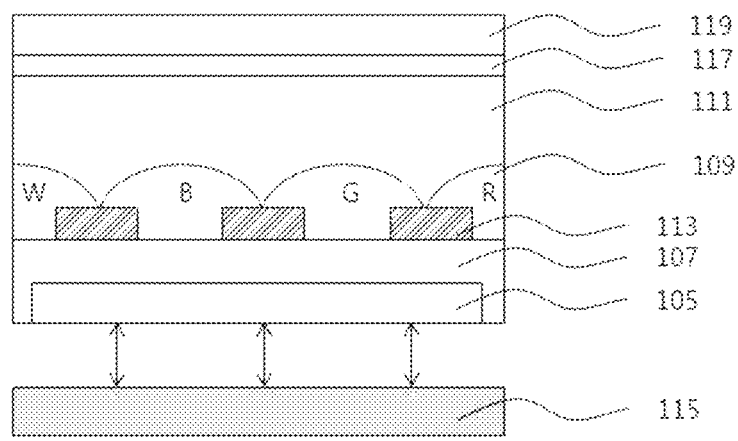
Figure 9:
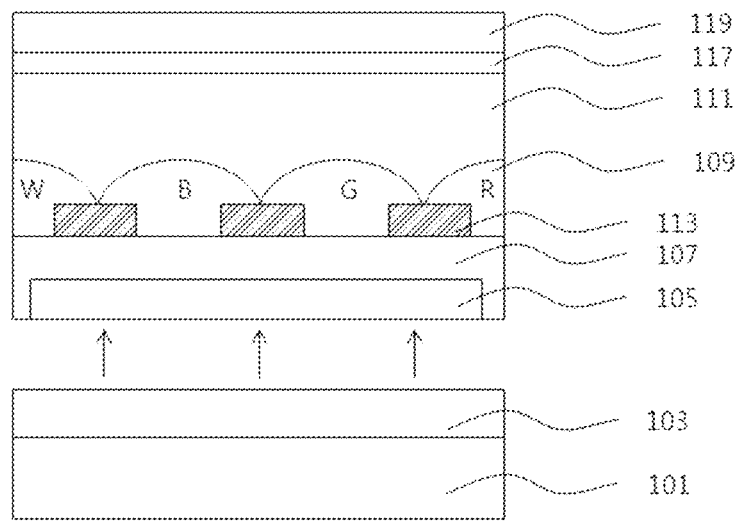
Figure 10:
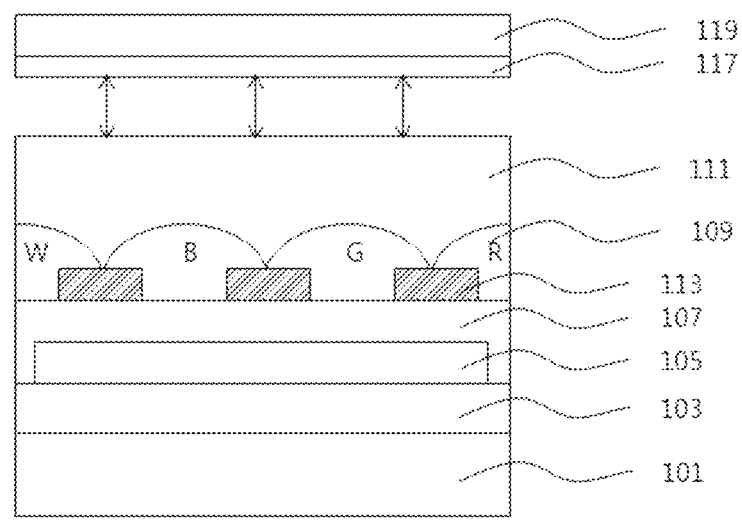

A flexible color filter 100 according to an exemplary embodiment of the present invention can be manufactured through the process including the steps of:

forming a separation layer 105 by coating a composite material for forming the separation layer on a glass substrate 115 as illustrated in FIG. 2;

forming a protection layer 107 by coating a composite material for forming the protection layer on the separation layer 105 so that the side surfaces of the separation layer 105 are encompassed thereby as illustrated in FIG. 3;

forming a black matrix (BM) layer 113 on the protection layer 107 followed by forming a red, a green, a blue, and a white pixel layer 109 between different portions of the black matrix layer as illustrated in FIGS. 4 and 5;

forming a planarization layer 111 by coating a composite material for forming the planarization layer all over the pixel layer 109 as illustrated in FIG. 6;

adhering a protection film 119, wherein a pressure sensitive adhesive layer 117 is coated on the one side surface thereof, with the planarization layer 111 as illustrated in FIG. 7;

separating the glass substrate 115 from the separation layer 105 as illustrated in FIG. 8;

adhering a base material film 101, wherein the adhesive layer 103 is coated on the one side surface thereof, with the separation layer 105 as illustrated in FIG. 9; and removing the protection film 119 and a pressure sensitive adhesive layer 117 from the planarization layer 111 as illustrated in FIG. 10.

Of course, the step of forming the protection layer 107 and the step of forming the planarization layer 111 can be omitted as necessary, and the black matrix layer 113 and the pixel layer 109 can be referred to as color filter layer.

Hereinafter, each step will be described more in detail with reference to the accompanying drawings.

First, a glass substrate 115 is prepared and a separation layer 105 is formed by coating the composite material for forming the separation layer (Refer to FIG. 2).

As for the coating method, a commonly used wet coating method can be used in order to obtain a desired thickness, and at this time, a coating apparatus such as roll coater, spin coater, slit and spin coater, slit coater (also called as 'die coater'), ink jet, and the like may be used for the wet coating method.

The composite material for forming the separation layer is being coated and then cured to form a separation layer 105. At this time, the curing process is performed by heating with an oven, hot plate, and the like. Although the curing temperature and time may vary depending on the composite material, for an example, it is performed through the heat treatment at temperature of 80 to 250° C. for 10 to 120 min.

Next, a protection layer 107 is formed by coating composite material for forming the protection layer on the separation layer 105 (Refer to FIG. 3).

As previously described, the separation layer 105 can be peeled off by a physical force because of its very weak peel strength, therefore, it is preferred that the protection layer 107 is formed to encompass the both side surfaces of the separation layer 105. The coating method and the curing process of the composite material for forming the protection layer would be the same as described above.

Next, a black matrix (BM) layer 113 is formed on the separation layer 105 or the protection layer 107 which had been previously formed, and therebetween a red, a green, a blue, and a white pixel layer 109 is formed (Refer to FIGS. 4 and 5).

After forming the black matrix layer 113 on the protection layer 107 so as to define the areas wherein the pixels are to be formed, the composite materials for forming the pixel layer for expressing corresponding color is coated respectively, and being formed through light exposure using a predetermined pattern, development, and thermal curing. The order of the colors of the pixel layer 109 may be arbitrarily selected. Also, it may be changed depending on the forming order and purpose of the black matrix layer 113 and the pixel layer 109. The coating method and the curing process of the black matrix layer 113 and the pixel layer 109 would be the same as described above.

Next, a planarization layer 111 is formed by coating the composite material for forming the planarization layer all over the pixel layer 109 which had previously formed (Refer to FIG. 6).

The planarization layer 111 is to protect the patterned pixel layer and later to planarize the surface of the color filter when forming the pixel electrodes, and formed all across the surface of the pixel layer 109. The coating method and the curing process of the planarization layer 111 would be the same as previously described.

Next, a protection film 119, wherein a pressure sensitive adhesive layer 117 is coated in the one surface thereof, is adhered with the planarization layer 111 (Refer to FIG. 7).

A material, whose physical properties are controlled to have proper mechanical hardness, thermal stability, moisture shielding, and transparency so as to protect the flexible color filter 100 of the present invention, is used for the protection film 119.

For an example, polyethylene, polypropylene, polystyrene, polyethylene terephthalate, polybutyleneterephtalate, polyehtylenenaphthalate, polyetherimide, polyvinyl chloride, and the like are the ones.

The pressure sensitive adhesive layer 117 is not particularly limited in the present invention, and a commonly used composition in this technical field can be used. Typically, any one selected from a group consisting of: acrylic resin, silicon resin, polyester, polyurethane, polyamide, polyvinyl ether, degenerated polyolefin, vinyl acetate/vinyl chloride copolymer, epoxy, fluorine, rubber, and a combination thereof may be used.

The pressure sensitive adhesive layer 117 could be the one directly deposited (coated) on the protection film 119, or the one formed by laminating an adhesive sheet to the protection film 110, and the thicknesses of the protection film 119 and the pressure sensitive adhesive layer 117 can be adjusted according to the material and the adhesive power of the protection film.

Next, the glass substrate 115 and the separation layer 105 are separated (Refer to FIG. 8).

The separation layer 105 is being peeled off in order to remove the glass substrate 115 which had been used for forming the color filter. The peeling off process is performed at room temperature, and for example, it may be performed by using a physical peeling off method wherein the glass substrate is peeled off by using a physical force.

Next, a base material film 101, wherein the adhesive layer 103 is deposited (coated) on the one side surface thereof, is adhered to the separation layer 105 (Refer to FIG. 9). The base material film 101 can be selected from the above mentioned materials with flexibility appropriate to the desired purpose.

The adhesive layer 103 is used for bonding the base material film 101 and the color filters, and disposed on the one surface of the base material film 101 or the separation layer 105.

Usable adhesive is a photo-curing adhesive, and the productivity is enhanced through the simplification of the manufacturing process since a separate drying process is not necessary after photo-curing process.

The photo-curing adhesive used in the exemplary embodiment of the present invention can be formed by using any photo-curing adhesives which are being used in this technical field without any particular limitation. For example, it may include composite materials containing epoxy compound or acrylic monomers.

Furthermore, for photo-curing of the adhesive layer 103, electron beam, proton beam, neutron beam, and the like as well as the light sources such as far UV, UV, near UV, infrared (IR), and the like, and electro-magnetic waves such as X-ray, γ-ray, and the like may also be used; however, curing by UV light illumination is the most advantageous way when considering the curing speed, the availability of the illumination apparatus, the cost, and the like.

As for the light source for the above mentioned UV light illumination, high pressure mercury light, electrodeless lamp, ultra high pressure mercury lamp, carbon arc lamp, Xenon lamp, metal halide lamp, chemical lamp, black light, and the like may be used.

Next, the protection layer 119 and the pressure sensitive adhesive layer 117, which had been bonded in FIG. 6, are being removed (Refer to FIG. 10).

Figure 11:
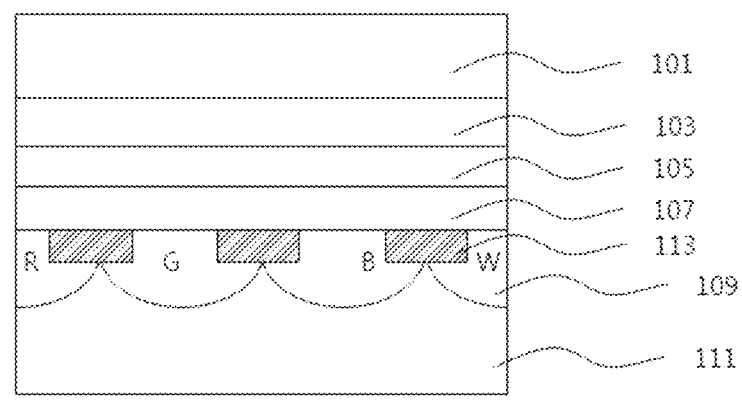

Finally, the flexible color filter 100 can be obtained as illustrated in FIG. 11 by removing the protection layer 119 and the pressure sensitive adhesive layer 117, which had been bonded in the previous step, for stacking of a touch sensor, a polarizer integrated touch sensor, or a window film whenever necessary later.

As described heretofore, in a manufacturing process of a flexible color filter 100 according to an exemplary embodiment of the present invention, process for forming color filter involving high temperature process is performed on a glass substrate and later the glass substrate is removed at the room temperature by using the separation layer 105, and then a base material film 101 made of plastic material is being stacked.

Thus, not only the problems related to thermal deformation of the plastic substrate of the prior art are resolved, but also high resolution patterns that cannot be implemented in a plastic substrate can be obtained; and diversification becomes possible without limitation in the materials of the base material film.

In addition, the flexible color filter according to an exemplary embodiment of the present invention not only prevents thermal deformation of the base material film of the prior art, but also high reliability can be obtained since there is no degradation in quality or malfunction caused by such aforementioned problem, and the dimensions of the pattern of the color filter are accurate and precise so that more precise pixels can be realized. Besides, various plastic materials can be used as a base material film according to the purpose thereof.

Meanwhile, the flexible color filter having the above described structure may be sold before separating the glass substrate according to the needs of the manufacturers or the request from the buyers.

That is, after the separation layer 105 is formed on the glass substrate 115, the protection layer 107 is formed on the separation layer 105. Such protection layer 107 may be an optional item. The black matrix layer 113 is formed on the separation layer 105 or the protection layer 108, then the pixel layer 109 is formed between different portions of the black matrix layer 113 (Refer to FIGS. 4 and 5). Next, the planarization layer 111 is formed all over the previously formed pixel layer 109 by coating the composite material for forming the planarization layer (Refer to FIG. 6). Such planarization layer 111 is also an optional item. Next, the protection film 119, wherein the pressure sensitive adhesive layer 117 is coated in the one surface thereof, is bonded to the planarization layer 111, and this can be shipped as a product (Refer to FIG. 7); and also, instead of bonding the protection film 119, a touch sensor or a polarizer integrated touch sensor can be bonded thereto, and this can be shipped as a product. Of course, a window film is bonded over the previously bonded touch sensor or the polarizer integrated touch sensor, and this can be shipped as a flexible color filter.

Embodiment Example 2 of Flexible Color Filter

Figure 12:
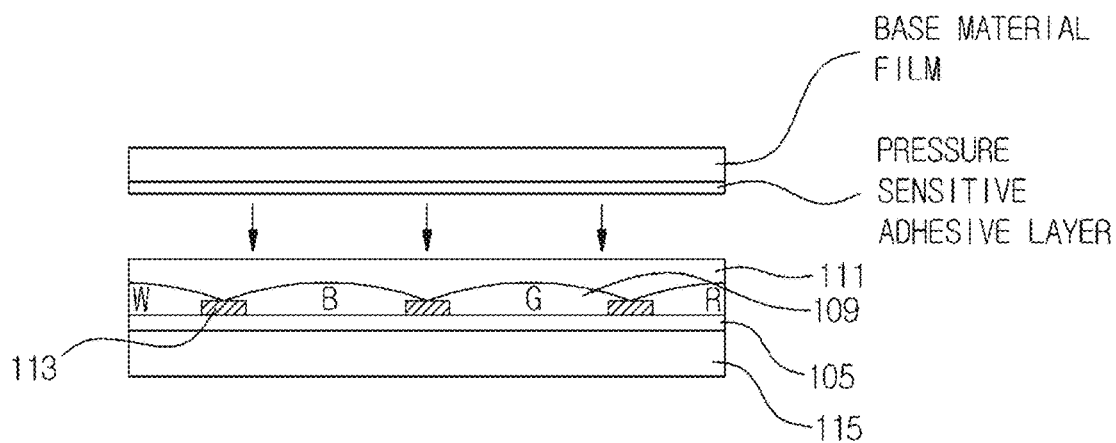
FIG. 12 is an exemplary view of another cross-sectional structure of a flexible color filter according to a modified exemplary embodiment of the present invention.

A flexible color filter according to an exemplary embodiment of the present invention, which is another modified exemplary embodiment, may be manufactured to have a cross-sectional structure as illustrated in FIG. 12.

That is, a separation layer 105 is formed by coating a composite material for forming the separation layer on a glass substrate 115 as illustrated in FIG. 12, and a protection layer 107 may be further formed by coating a composite material for forming the protection layer on the separation layer 105 as necessary.

And then, a color filter layer including a black matrix layer 113 and a pixel layer 109 is formed on the separation layer 105 or the protection layer 107, and then a planarization layer 111 is formed all over the pixel layer 109 by coating a composite material for forming the planarization layer.

When the forming of the planarization layer 111 is completed, a base material film, wherein a pressure sensitive adhesive layer is coated on the one surface thereof, is bonded to the planarization layer 111. When the forming step of the planarization layer 111 is omitted, the base material film is bonded directly on the pixel layer 109.

The flexible color filter manufactured according to such manufacturing process has a structure as illustrated in FIG. 12, wherein: a color filter layer including a basic material film, an adhesive layer, a planarization layer 111, a black matrix layer 113, and a pixel layer 109 formed between different portions of the black matrix layer; a separation layer 105; and a glass substrate 115 are sequentially and downwardly stacked.

The flexible color filter having such structure may be sold before separating the glass substrate 115 according to the needs of the manufacturers or the request from the buyers, and may also be sold with the glass substrate 115 peeled off.

A protection layer for protecting the separation layer 105 may further be formed between the color filter layer and the separation layer 105 in a flexible color filter having the cross-sectional structure as illustrated in FIG. 12; and it is characterized in that at least one layer selected from a group consisting of a base material film, a separation layer 105, a black matrix layer 113, a pixel layer 109, a planarization layer 111, and a combination thereof includes a polymer material sufficing the range 40 to 95% of the rate of change in shear stress which is defined as Equation 1 above.

In addition, at least one layer selected from a group consisting of a base material film, a separation layer 105, a black matrix layer 113, a pixel layer 109, a planarization layer 111, and a combination thereof includes a polymer material having a tensile modulus of 2 to 10 MPa as another special feature; and it is characterized in that the peel strength of the separation layer 105 against the glass substrate 115 is less than 1 N/25 mm, and the surface energy of the separation layer 105 after peeling off the glass substrate is in the range of 30 to 70 mN/m.

Embodiment Example 3 of Flexible Color Filter

By adding an additional process to the flexible color filter manufactured according to the first exemplary embodiment of the previously described flexible color filter, a flexible color filter wherein a touch sensor or a polarizer integrated touch sensor, or a window film is laminated may be manufactured.

That is, a flexible color filter, wherein a touch sensor or a polarizer integrated touch sensor, or a touch sensor and a window film, or a polarizer integrated touch sensor and a window film is laminated on the planarization layer 111 as illustrated in FIG. 11, may be manufactured and sold. When the planarization layer 111 is omitted, a touch sensor or a polarizer integrated touch sensor, or a touch sensor and a window film, or a polarizer integrated touch sensor and a window film may be laminated on the pixel layer 109.

Hereinafter, the flexible color filter according to an exemplary embodiment of the present invention will be described more in detail with reference to the following exemplary embodiments, which merely set forth to aid the understanding of the present invention, but the present invention is not limited thereto.

Experiment Example 1

(1) Evaluation of Shear Stress and Tensile Modulus of Polymer Material

After a 700 μm thick soda lime glass substrate was cleaned using isopropyl alcohol, the surface of the substrate was treated with $O_2$ plasma (1 sccm $O_2$ gas, process pressure of 10 mTorr, 500 W DC power, for 300 sec) in order to reform the surface thereof into hydrophilic one.

After a composite material for forming a separation layer comprising the composition of the following Table 1 was coated on the plasma treated glass substrate, a 0.3 μm thick separation layer was formed by drying at 230° C. for 30 minutes.

And then, a cycloolefin series protection layer was coated on the previously formed separation layer, and baked at 230° C. for 30 minutes, and a 2 μm thick film was obtained. The rate of change in shear stress at 25° C. of the obtained film was measured using Rheometer MCR-302 (a Product of Anton Paar). The shear stress was set to 10 MPa. After obtaining the stress value at the initial stage and at the elapsed time of 5 hr, the rates of change are presented in Table 1 below.

In addition, a sample of length of 5 cm and width of 1 cm was made from the above mentioned film, and load (weight) was applied thereto (sample) by using the Autograph (a Product of Shimadzu) at a speed of 4 mm/min along the vertical direction at 25° C. so that the gap between the chuck was being widened, and at this time the force was measured. The tensile modulus was calculated from the thickness of the film measured in advance with a micrometer, the force, and the amount of calculation; and the results are presented in Table 1 below.

(2) Measurement of Peel Strength and Surface Energy of Polymer Material

After a 700 μm thick soda lime glass substrate was cleaned using isopropyl alcohol, the surface of the substrate was treated with $O_2$ plasma (1 sccm $O_2$ gas, process pressure of 10 mTorr, 500 W DC power, for 300 sec) in order to reform the surface thereof into hydrophilic one.

After a composite material for forming a separation layer comprising the composition of the following Table 1 was coated on the plasma treated glass substrate, a 0.3 μm thick separation layer was formed by drying at 150° C. for 20 minutes.

And then, a cycloolefin series protection layer was coated on the previously formed separation layer, and after baking at 230° C. for 30 minutes the protection film (15 μm PSA/38 μm PET, a Product of Fujimori) wherein a pressure sensitive adhesive was coated was bonded on the soda lime glass substrate wherein the separation layer and the protection layer had been formed, and the film and the glass substrate were cut into the test sample of 25 mm in width and 100 mm in length, and the peel strength against the glass substrate and the surface energy after peeling off were measured.

The peel strength against the glass substrate was measured using Autograph Universal Testing Machine (UTM) (a Product of Shimadzu) under the condition of 300 mm/min peel speed at 90 degrees.

And, the surface energy was measured using the contact angle measurement meter CAM101 (a Product of KSV Instrument).

TABLE 1

| | Composition | Content (Wt %) | Polymer | Shear stress before curing (MPa) | Shear stress after curing (MPa) | Rate of change in shear stress (%) | Tensile modulus | Peel strength (N/25 cm) | Crack density (ea/cm$^2$) | Surface energy (mN/m) |
|---|---|---|---|---|---|---|---|---|---|---|
| 1 | A/C/D | 10/1/89 | Polyacryl series | 10 | 0.9 | 91 | 2 | 0.05 | 0 | 55 |
| 2 | A/B/D | 10/1/89 | | 10 | 4.1 | 50 | 6 | 0.05 | 0 | 55 |
| 3 | A/B/C/D | 10/1/3/86 | | 10 | 5.1 | 40 | 8.5 | 0.05 | 0 | 55 |
| 4 | A/B/C/D | 10/5/1/84 | | 10 | 6.4 | 47 | 12 | 0.05 | 5 | 55 |

A: Acrylic series copolymer
B: Acrylic series monomer
C: Melamine series curing agent (hardener)
D: Propylene glycol mono methyl ether acetate Embodiment Example 1 and Comparative Example 1: Manufacturing of Flexible Color Filter Embodiment Example 1

After a composite material for forming a separation layer comprising the composition described in item 1 of the above Table 1 was coated on the glass substrate, a 0.3 µm thick separation layer was formed by drying at 230° C. for 30 minutes. And then, a protection layer was coated to encompass the both side surfaces of the separation layer, and a 1.5 µm thick protection layer was formed by drying at 230° C. for 20 minutes.

Next, a black matrix layer (TBK-04) and a plurality of patterned pixel layer (TR-800, YG-800, YB-800) were formed on the protection layer.

And then, after a planarization film (DW-LT09) was formed on the pixel layer, the planarization layer and the protection film wherein a pressure sensitive adhesive had been attached (15 µm PSA/38 µm PET, a Product of Fujimori) were bonded thereto.

And then, after the glass substrate is peeled off and separated from the separation layer, a color filter was manufactured by stacking a base material film wherein an adhesive (KR15P, a Product of ADEKA) had been coated thereon.

The process temperatures at this time are presented in Table 2 below.

Comparative Example 1

The composite material for forming the separation layer was manufactured using the same method as that of the above Embodiment Example 1 except that the composition 4 in Table 1 was used instead of composition 1 in Table 1.

TABLE 2

| | Process | Temperature |
|---|---|---|
| 1 | Heat treatment after coating separation layer | 230° C. |
| 2 | Heat treatment after coating protection layer | 230° C. |
| 3 | Heat treatment after forming black matrix | 230° C. |
| 4 | Heat treatment after forming pixel layer | 230° C. |
| 5 | Separation of protection layer | 50° C. |
| 6 | Bonding after coating adhesive | Room Temperature |

The results of comparison between the flexible color filter finally obtained through the above Embodiment Example and Comparative Example verified that the flexible color filter according to Embodiment Example 1 was superior in the aspects of appearance and quality, and in case of Comparative Example 1, the flexible color filter could not be manufactured since peeling did not occur.

In addition, referring to Table 2 above, the process of the flexible color filter according to the exemplary embodiment of the present invention could be performed at the heat treatment temperature of 230° C. since a glass substrate was used instead of a plastic substrate of the prior art.

Meanwhile, the flexible color filter according to the exemplary embodiment of the present invention can implement a flexible (white) OLED display by being integrally formed on the substrate of an organic light-emitting diode or a white organic light-emitting diode.

Hereinafter, a structure and a manufacturing method of a flexible (white) OLED display including the flexible color filter according to the exemplary embodiment of the present invention will be described more in detail.

Embodiment Example 1 of Flexible OLED Display Comprising Flexible Color Filter

Figure 13:
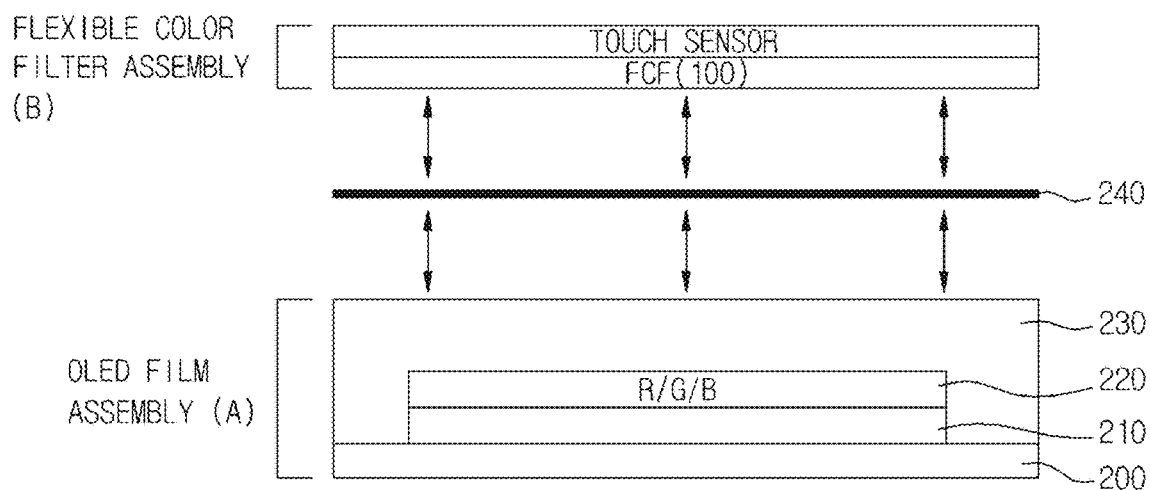
FIG. 13 is an exemplary view of a cross-sectional structure of the flexible OLED display including flexible color filter according to an exemplary embodiment of the present invention.
Figure 14:
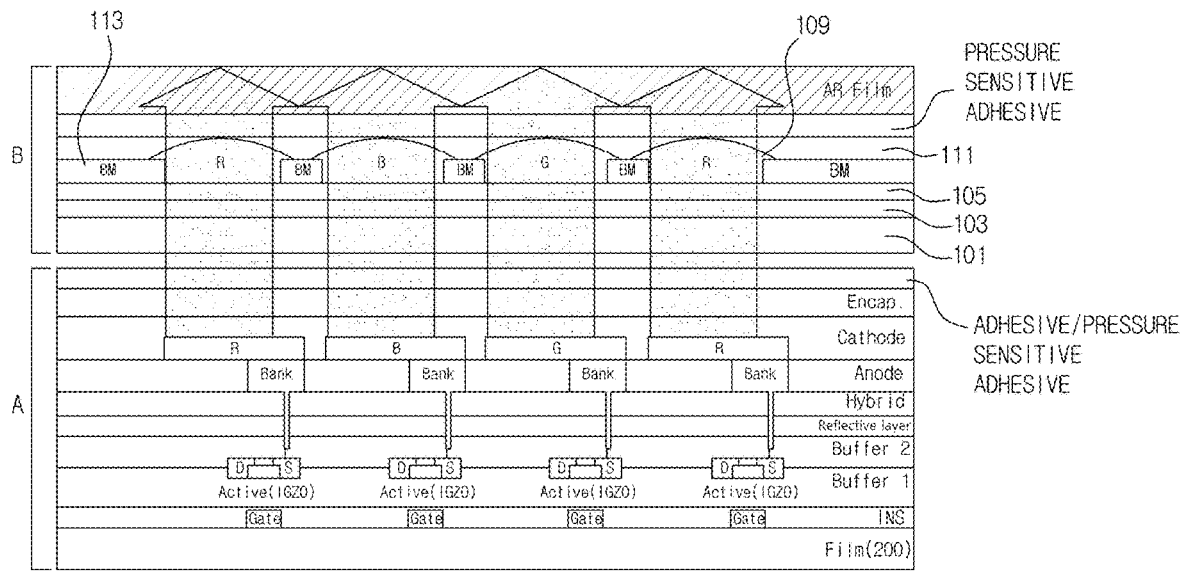
FIG. 14 is an exemplary view of a detailed cross-section of the flexible OLED display illustrated in FIG. 13.

FIG. 13 is an exemplary view of a cross-sectional structure of the flexible OLED display including flexible color filter according to an exemplary embodiment of the present invention. FIG. 14 is an exemplary view of a detailed cross-section of the flexible OLED display illustrated in FIG. 13.

As illustrated in FIG. 13, the flexible OLED display comprising the flexible color filter according to the exemplary embodiment of the present invention has a structure wherein a flexible color filter assembly B is bonded, by using an adhesive layer 240, on an OLED film assembly A formed with organic light-emitting layer of a red R, a green G, and blue B colors.

Referring to FIG. 13, first, at least a thin film transistor 210, an organic light-emitting layer 220 of R, G, and B (or W, R, G, and B), an encapsulation 230, and at least one insulation layer (insulating membrane between layers etc.) are formed on the film 200 of the OLED film assembly A. Such detailed configuration of an OLED film assembly A is illustrated in FIG. 14. The detailed configuration of an OLED film assembly A illustrated in FIG. 14 is merely set forth to aid the understanding of the present invention, but the configuration and the structure of the OLED film assembly A will not be limited thereto.

Referring to FIG. 14, a gate electrode is formed on the film 200 of the OLED film assembly A, and a gate insulation layer INS is formed on the film 200 including the gate electrode. An active layer is formed on the gate insulation layer INS, and the source S and the drain D regions of the active layer are doped with n-type or p-type impurities, and a channel region connecting the source S and the drain D regions is provided.

An insulation layer (Buffer 1) is formed on the active layer, and such insulation layer (Buffer 1) is to protect the channel of the active layer, and it can be designed to cover the entire active layer except the regions where the electrodes are being contacted, however, it is not necessarily limited to this, it may also be formed only on the upper portion of the channel.

Electrodes of the source S and the drain D which are to be contacted with the active layer are formed on the insulation layer (Buffer 1), and a passivation layer (Buffer 2) is formed on the insulation layer (Buffer 1) to cover the electrodes of the source S and the drain D. We may consider that a thin film transistor is formed on the OLED film assembly A through such processes.

Meanwhile, an OLED which is electrically connected to one of the source S and drain D electrodes is formed. The OLED is obtained (formed) in a way that a first electrode (Anode) which is connected to one of the source S and drain D electrodes is formed, and after forming the organic layer of R, G, and B on the first electrode (Anode) a second electrode (Cathode) is formed on the organic layer R, G, and B. We may consider that an organic light-emitting layer 220 is formed on the OLED film assembly A through such processes.

An encapsulation may further be formed as a protection layer over the second electrode (Cathode).

According to the above description, the OLED film assembly A illustrated in FIG. 14 has same technical configuration as that of the OLED film assembly illustrated in FIG. 13 (That is, a configuration formed with at least one of a thin film transistor 210, organic light-emitting layer 220 of R, G, and B, an encapsulation 230, and at least one insulation layer (insulation membrane between layers, etc.)).

In this way, a flexible OLED display can be obtained by bonding a flexible color filter (FCF) 100 according to an exemplary embodiment of the present invention onto the OLED film assembly A, wherein at least a thin film transistor 210, organic light-emitting layer 220 of R, G, and B, an encapsulation 230, and at least one insulation layer (insulation membrane between layers, etc.) are formed, by using an adhesive layer 240 as an intermediate medium.

The flexible color filter (FCF) 100 is a color filter wherein a base material film 101, an adhesive layer 103, a separation layer 105, a black matrix layer 113, a pixel layer 109 formed between different portions of the black matrix layer 113, and a planarization layer 111 are sequentially stacked. Of course, the planarization layer 111 may be omitted as necessary.

As a modifiable exemplary embodiment, one of 'an anti-reflection (AR) film' or 'a touch sensor' or 'a touch sensor and a window film' may further be laminated with the flexible color filter (FCF) 100. The flexible color filter (FCF) 100 wherein an AR film or a touch sensor or 'a touch sensor and a window film' is laminated can be named as a flexible color filter assembly B.

In addition, as previously described, the flexible color filter (FCF) 100 may have a structure wherein a protection layer is further be formed for protecting the separation layer disposed between the separation layer 105 and the black matrix layer 113.

The properties of the flexible color filter (FCF) 100 being bonded onto the OLED film assembly A or the individual layers constituting the flexible color filter (FCF) 100, for example, the rate of change in shear stress, the tensile modulus, materials, the peel strength against the glass substrate of the separation layer, the surface energy after peeling of the separation layer, and the like will be omitted hereinafter since they are same as those of the flexible color filter 100 described in detail in FIGS. 1 to 11.

For reference, a method for manufacturing the flexible OLED display illustrated in FIG. 14 will be additionally described here with reference to FIG. 14: first, a separation layer 105 is formed on a glass substrate (not shown here since it is separated during the process thereof); a color filter layer including a black matrix layer 113 and the pixel layer 109 formed between different portions of the black matrix layer 113 is formed on the separation layer 105; and a planarization layer 111 is formed on the color filter layer.

And then, after bonding a protection film wherein a pressure sensitive adhesive layer is coated on one surface thereof or a first base material film to the planarization layer 111, the glass substrate is separated from the separation layer 105.

And then, a second base material film 101, wherein an adhesive layer 103 is coated in one surface thereof, is bonded to the separation layer 105, and thus a flexible color filter (FCF) 100 is manufactured.

When the flexible color filter (FCF) 100 is manufactured in this way, a flexible OLED display including the flexible color filter 100 as illustrated in FIG. 14 can be manufactured by bonding the second base material film 101 onto the OLED film assembly wherein at least one of a thin film transistor 210, organic light-emitting layer 220 of R, G, and B, an encapsulation 230, and at least one insulation layer are formed on the film 200 thereof.

Further, after the separation of the protection film or the first base material film which is formed on the flexible color filter 100, one of 'an AR film' or 'a touch sensor' or 'a touch sensor and a window film' can be laminated on the planarization layer 111 on the top side of the second base material film.

Of course, the protection film or the first base material film is (can be) separated before bonding the flexible color filter 100 onto the OLED film assembly A, and then any one of 'an AR film' or 'a touch sensor' or 'a touch sensor and a window film' is laminated with the planarization layer 111, and then the flexible color filter 100 and the OLED film assembly A may be bonded together.

Embodiment Example 2 of Flexible OLED Display Comprising Flexible Color Filter

Figure 15:
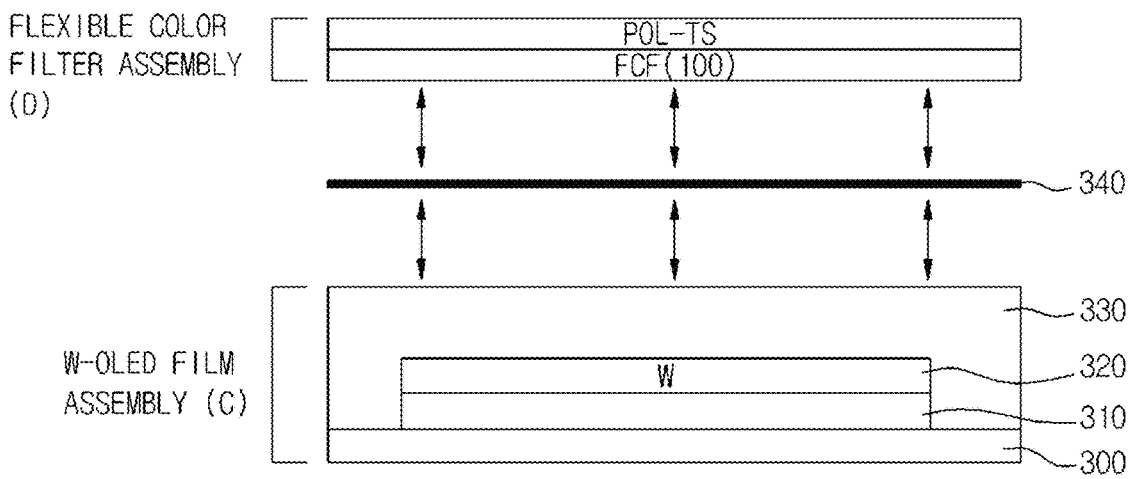
FIG. 15 is an exemplary view of another cross-sectional structure of the flexible OLED display including flexible color filter according to an exemplary embodiment of the present invention.

FIG. 15 is an exemplary view of another cross-sectional structure of the flexible OLED display including flexible color filter according to an exemplary embodiment of the present invention, more particularly, an exemplary view of the cross-sectional structure of the flexible white OLED display.

The flexible white OLED display illustrated in FIG. 15 includes: a white OLED (W-OLED) film assembly C wherein at least a thin film transistor 310, a white organic light-emitting layer 320, an encapsulation 330, and at least one insulation layer are formed on a film 300; and a flexible color filter (FCF) 100 which is being bonded on the white OLED (W-OLED) film assembly C using an adhesive 340, wherein the flexible color filter (FCF) 100 is a color filter wherein a base material film 101, an adhesive layer 103, a separation layer 105, a black matrix layer 113, a pixel layer 109 formed between different portions of the black matrix layer 113, and a planarization layer 111 are sequentially stacked. Even in such exemplary embodiment, the planarization layer 111 may be removed as necessary.

As a modifiable exemplary embodiment, the flexible white OLED display may further include a polarizer integrated touch sensor (POL-TS) which is being bonded onto the flexible color filter (FCF) 100; and as another modifiable exemplary embodiment, the flexible white OLED display may further include a 'touch sensor (TS)' or 'a touch sensor and a window film' to be bonded onto the flexible color filter (FCF) 100.

Also, the flexible color filter (FCF) 100 may further include a protection layer for protecting the separation layer disposed between the separation layer 105 and the black matrix layer 113.

For reference, the flexible color filter (FCF) 100 wherein a polarizer integrated touch sensor (POL-TS) or a touch sensor or 'a touch sensor and a window film' is bonded thereto may be referred to as a flexible color filter assembly D.

Furthermore, since the white flexible white OLED display illustrated in FIG. 15 also belongs to the category of flexible OLED displays, all of them may be referred to as the one of the flexible OLED displays.

The properties of the flexible color filter (FCF) 100 being bonded onto the W-OLED film assembly C or the individual layers constituting the flexible color filter (FCF) 100, for example, the rate of change in shear stress, the tensile modulus, materials, the peel strength against the glass substrate of the separation layer, the surface energy after peeling of the separation layer, and the like will be omitted hereinafter since they are same as those of the flexible color filter 100 described in detail in FIGS. 1 to 11. The detailed configuration of the W-OLED film assembly A illustrated in FIG. 15 is also an exemplary example merely to aid the understanding of the present invention, and the configuration and the structure of the W-OLED film assembly A are not limited thereto.

A method for manufacturing the flexible OLED display illustrated in FIG. 15 will be additionally described here.

First, a separation layer 105 is formed on a glass substrate to manufacture the flexible color filter (FCF) 100. Next, a black matrix layer 113 and a color filter layer including a pixel layer 109 being formed between different portions of the black matrix layer 113 are formed, and then a planarization layer 111 is formed on the color filter layer.

And then, after bonding either a protection film, wherein a pressure sensitive adhesive layer is coated on one surface thereof, or a first base material film to the planarization layer 111, the separation layer 105 is being separated from the glass substrate.

And then, the second base material film 101, wherein an adhesive layer is coated on one surface thereof, is bonded to the separation layer 105; then, the second base material film 101 is bonded to the OLED film assembly C, wherein at least a thin film transistor 310, organic light-emitting layer 320 of R, G, and B, an encapsulation 330, and at least one insulation layer are formed; and thus a white OLED display is manufactured wherein the flexible color filter (FCF) 100 is bonded to the OLED film assembly C.

As a modifiable manufacturing method, the protection film or the first base material film is separated before or after the bonding of the flexible color filter (FCF) 100 to the OLED film assembly C; then one of 'a polarizer integrated touch sensor (POL-TS)' or 'a touch sensor' or 'a touch sensor and a window film' is laminated with the planarization layer 111 disposed on the top of the second base material film; and in this way a flexible W-OLED display can also be manufactured.

As previously described, in a manufacturing process of the flexible color filter (FCF) 100, a step for forming a protection layer may further be included for protecting the separation layer between the separation layer 105 and the black matrix layer 113.

As described heretofore, the flexible OLED displays including flexible color filter 100 according to the exemplary embodiments of the present invention, can be applied to the various fields, which require bendability and flexibility, such as automation equipment, smart phone, display, solar cell, electronic paper, and the like, with various shapes, since the problems occurring due to the thermal deformation of the plastic material have been solved.

INDUSTRIAL APPLICABILITY

The flexible color filter according to the exemplary embodiment of the present invention can be applied as a color filter of a flexible W-OLED display.

DESCRIPTION OF SYMBOLS

100: flexible color filter
101: base material film
103: adhesive layer
105: separation layer
107: protection layer
109: pixel layer
111: planarization layer
113: black matrix layer
115: glass substrate
117: pressure sensitive adhesive layer
119: protection film

The invention claimed is:

1. A flexible color filter having a structure comprising:
a base material film;
an adhesive layer formed on the base material film;
a separation layer formed on the adhesive layer;
a black matrix layer formed on the separation layer; and
a pixel layer formed between different portions of the black matrix layer,
wherein the separation layer is formed of a composition of A/C/D and A/B/D,
wherein the A is Acrylic series copolymer, the B is Acrylic series monomer, the C is Melamine series curing agent and the D is Propylene glycol mono methyl ether acetate.

2. The flexible color filter according to claim 1, wherein the structure further comprises a planarization layer stacked on the pixel layer.

3. The flexible color filter according to claim 1, in the structure one of a touch sensor, a polarizer integrated touch sensor and a window film, or a stacked combination of at least one thereof, is laminated on the pixel layer.

4. The flexible color filter according to claim 1, the structure further comprises a protection layer stacked between the separation layer and the black matrix layer.

5. The flexible color filter according to claim 1, wherein at least one selected from a group consisting of the base material film, the separation layer, the black matrix layer, the pixel layer, and a combination thereof includes a polymer material sufficing the range 40 to 95% of rate of change in shear stress as defined by Equation 2:

$$\text{Rate of change in shear stress } (\%) = \frac{SS_1 - SS_0}{SS_0} \times 100, \quad [\text{Equation 2}]$$

where $SS_0$ is shear stress (MPa) measured in an initial stage of curing under a temperature between 15 to 30° C., and $SS_1$ is shear stress (MPa) measured 5 hours after the curing under a temperature between 15 to 30° C.

6. The flexible color filter according to claim 1, wherein at least one selected from a group consisting of the base material film, the separation layer, the black matrix layer, the pixel layer, and a combination thereof includes a polymer material whose tensile modulus is in a range of 2 to 10 MPa.

7. The flexible color filter according to claim 1, wherein at least one selected from a group consisting of the base material film, the black matrix layer, the pixel layer, and a combination thereof includes a material selected from a group consisting of: polyacrylate, polymethacrylate, polyimide, polyamide, polyamic acid, polyvinyl alchohol, polyolefin, polystyrene, polynorbornen, polymaleimide, polyazobenzene, polyester, polyallylate, phthalimidine, polyphenylenephthalamide, polyvinylcinnamate, polycinnamate, coumarin-series polymer, chalcone polymer, aromatic acetylene series polymer, phenyl maleimide copolymer, copolymers thereof, and blends thereof.

8. The flexible color filter according to claim 1, wherein a peel strength of the separation layer against the glass substrate is less than 1 N/25 mm.

9. The flexible color filter according to claim 1, wherein a surface energy of the separation layer after separation of the glass substrate is in a range of 30 to 70 mN/m.

* * * * *